United States Patent [19]

Wills

[11] Patent Number: 4,912,066
[45] Date of Patent: Mar. 27, 1990

[54] MAKE-LINK PROGRAMMING OF SEMICONDUCTOR DEVICES USING LASER-ENHANCED THERMAL BREAKDOWN OF INSULATOR

[75] Inventor: Kendall S. Wills, Houston, Tex.

[73] Assignee: Texas Instruments Incorporated, Dallas, Tex.

[21] Appl. No.: 164,763

[22] Filed: Mar. 7, 1988

Related U.S. Application Data

[60] Division of Ser. No. 912,205, Sep. 24, 1986, Pat. No. 4,751,197, which is a continuation of Ser. No. 632,076, Jul. 18, 1984, abandoned.

[51] Int. Cl.⁴ .......................................... H01L 21/265
[52] U.S. Cl. ..................................... 437/173; 437/174; 437/19; 437/922; 148/DIG. 59
[58] Field of Search ................. 437/19, 173, 174, 922, 437/228, 233, 225, 247, 192, 193; 148/DIG. 55; 219/121 LG, 121 LH, 121 LJ; 357/71

[56] References Cited

U.S. PATENT DOCUMENTS

| | | | |
|---|---|---|---|
| 4,617,723 | 10/1986 | Mukai | 437/19 |
| 4,636,404 | 1/1987 | Raffel et al. | 437/19 |
| 4,665,295 | 5/1987 | McDavid | 437/173 |

Primary Examiner—Brian E. Hearn
Assistant Examiner—Kevin McAndrews
Attorney, Agent, or Firm—Theodore D. Lindgren

[57] ABSTRACT

A semiconductor device is programmed by a laser beam which causes an insulator between two conductors on a silicon substrate to be permanently altered, as by breakdown of the insulator. The conductors may be metals such as aluminum or tungsten, and the insulator is a layer of deposited or thermal silicon oxide. The breakdown may be enhanced by voltage applied between the conductors while the laser beam is focused on the structure.

1 Claim, 3 Drawing Sheets

1

MAKE-LINK PROGRAMMING OF SEMICONDUCTOR DEVICES USING LASER-ENHANCED THERMAL BREAKDOWN OF INSULATOR

This is a division of application Ser. No. 912,205, filed Sept. 24, 1986 (now Pat. No. 4,751,197, issued June 14, 1988). That application is a continuation of application Ser. No. 632,076, filed July 18, 1984, now abandoned.

BACKGROUND OF THE INVENTION

This invention relates to semiconductor devices, and more particularly to laser programming of such devices.

Various methods have been employed for selectively programming semiconductor devices after manufacture is essentially complete. For example, redundant memory chips are programmed to bypass faulty parts of the memory which are identified in testing. In one commonly used method, a polysilicon or other conductive strip on the surface of the chip is melted through by a laser beam at the desired positions; this is known as laser break-link programming. In bipolar PROMs, conductors are melted at narrow high resistance areas by electrical pulses. In some devices of this type an oxide is broken down by laser beam or by over voltage shorting together two conductors and providing make-link instead of break-link programming. The heating effect of a laser beam has also been used to diffuse impurity into a silicon or polysilicon area to change its conductivity—providing a programming method. The effect of laser heating for altering the dopant distribution in silicon devices has been reported.

Prior devices of this type have required excess space on the chip for the link structures or the circuits needed to program the links. The laser blown fuses have created problems due to the craters produced in the surface of the chip by the laser beam.

It is the principal object of this invention to provide an improved method of programming of semiconductor devices, particularly by laser beam make-link programmable elements. Another object is to provide a laser programming method which requires less space on the semiconductor substrate for implementation. A further object is to provide a laser programming method which is less disruptive of the surrounding structure and materials, and/or which leaves a minimum of residue. Other objects include lower dwell time needed for the laser beam (thus faster programming) and lower power (thus less heating).

SUMMARY OF THE INVENTION

A semiconductor device is programmed by a laser beam which causes an insulator between two conductors on a silicon substrate to be permanently altered, as by breakdown of the insulator. The conductors may be metals such as aluminum or tungsten, and the insulator is a layer of deposited or thermal silicon oxide. The breakdown may be enhanced by voltage applied between the conductors while the laser beam is focused on the structure.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE SPECIFIC EMBODIMENT

Figure 1:
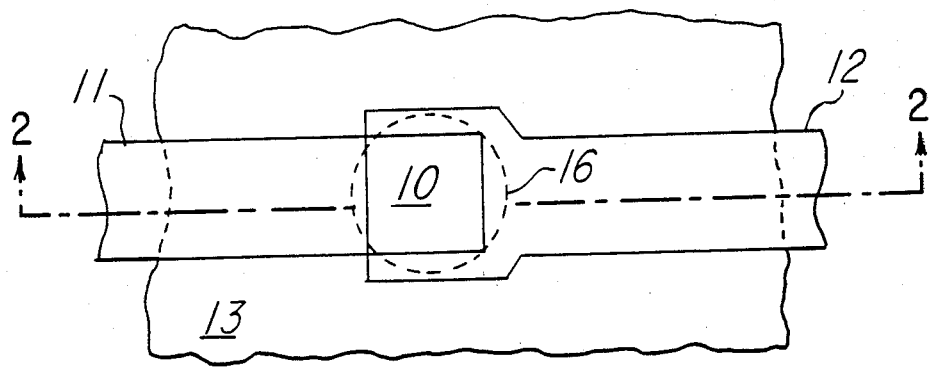
FIG. 1 is a plan view, greatly enlarged, of a part of a semiconductor chip having the make-link laser beam programmable structure of the invention.
Figure 2:
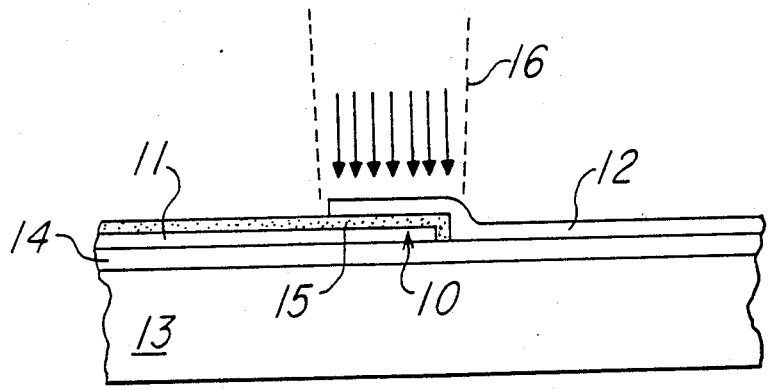
FIG. 2 is an elevation view in section of the device of FIG. 1, taken along the line 2—2 in FIG. 1.

Referring to FIGS. 1 and 2, a semiconductor device is illustrated which has a make-link structure 10 between two deposited conductors 11 and 12, on a silicon substrate 13. An insulator layer 14 or other coatings or layers may cover the silicon beneath the make-link structure. An oxide coating 15 is interposed between the two conductors 11 and 12 to provide the make-link structure; this oxide 15 is subjected to heating by a laser beam 16 to break down the oxide and short the two conductors 11 and 12 together. One example of materials which may be used as the conductors 11 and 12 is tungsten, along with a deposited silicon oxide layer 15, or alternatively a silicon nitride layer 15. Or, the top layer 12 may be aluminum, as another example. As well, the bottom layer 11 may be another refractory metal such as molybdenum, or may be aluminum. Polycrystalline silicon may by used as the layer 11, in which case the insulator 15 may be thermally-grown silicon oxide of about 200 Å instead of deposited oxide. The metals selected should not form a rectifying contact when shorted together. The link area 10 should not be covered with a protective overcoat layer which would impair heating by the laser beam.

If the make-link structure is used in a redundant memory device, the device would be completely processed in slice form and tested at a multi-probe test station to determine what rows or columns were faulty, and the addresses of faulty rows or columns would then be programmed into the chip at the test station by indexing the laser beam to certain ones of many of the make-link structures 10 on a device. The slice would contain hundreds of the memory devices, so the multi-probe testing and laser programming would proceed from device to device on the slice.

A laser is selected of wavelength which is absorbed by the materials of the make-link structure. For example, an Argon ion laser at a wavelength of 0.488 micron, or a Nd:YAG laser at 1.06 microns, with a beam size of 6 microns, will short tungsten layers separated by 200 Å silicon oxide in much less than 20 ms if the power is one microjoule per pulse. A voltage of 5 to 20 volts can be applied between the conductors 11 and 12 to enhance the reaction at the interface and reduce the time and laser beam energy needed to create a short. When aluminum is used as one of the metals, a hydrogen atmosphere creates a sintering operation to react the aluminum with the oxide at the interface.

Figure 3:
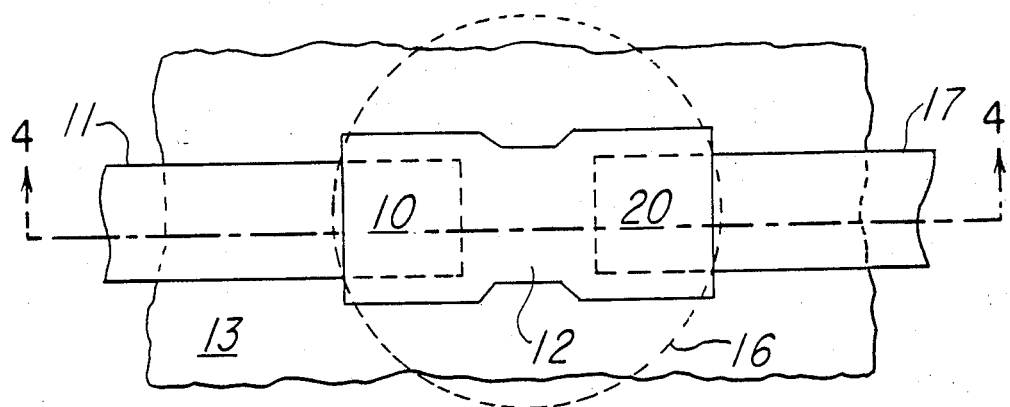
FIG. 3 is a plan view, greatly enlarged, of a part of a semiconductor chip having the make-link laser beam programmable structure according to another embodiment of the invention.
Figure 4:
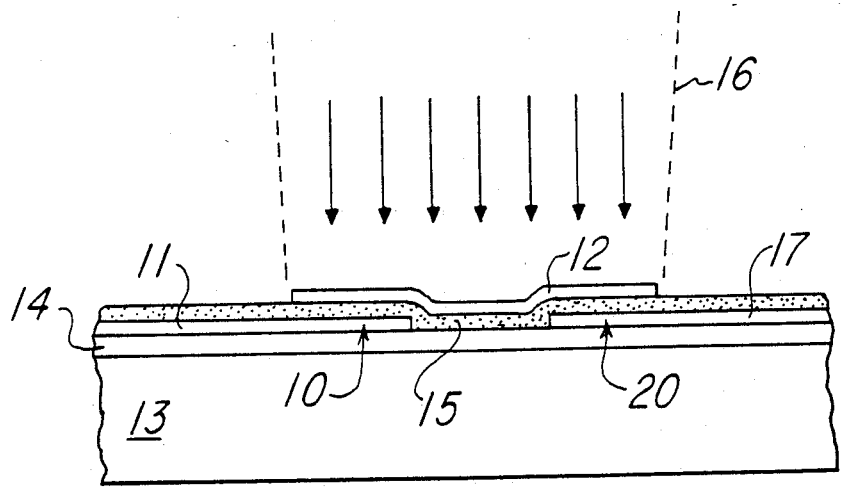
FIG. 4 is an elevation view in section of the device of FIG. 4, taken along the line 4—4 in FIG. 3.

Another example of a make-link structure is shown in FIGS. 3 and 4. Another conductor strip 17 is added to the structure of FIGS. 1 and 2, so the laser beam covers two interfaces 10 and 20. The conductors 11 and 17 may be different materials, or these may be the same material. One advantage of this structure is that it can be used to make a contact between two conductive materials in strips 11 and 17 which could not interface with one another due to non-ohmic contact, corrosion, etc.

Figure 5:
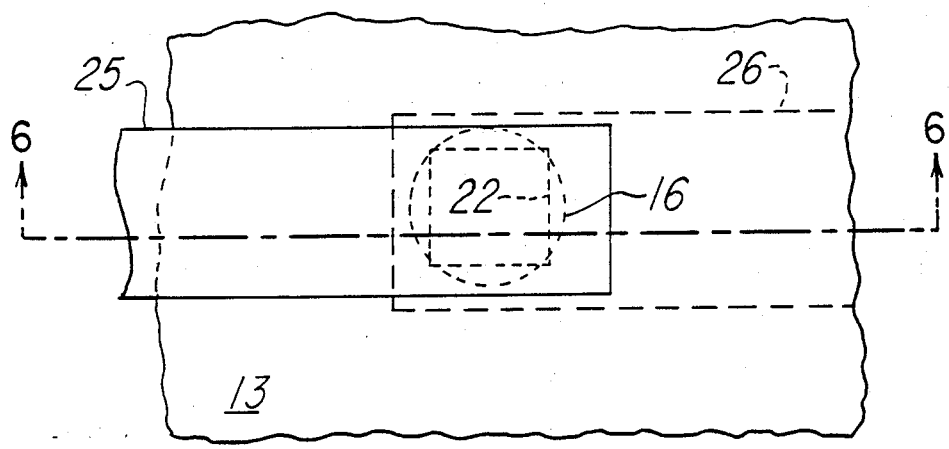
FIG. 5 is a plan view, greatly enlarged, of a part of a semiconductor chip having the make-link laser beam programmable structure according to still another embodiment of the invention.
Figure 6:
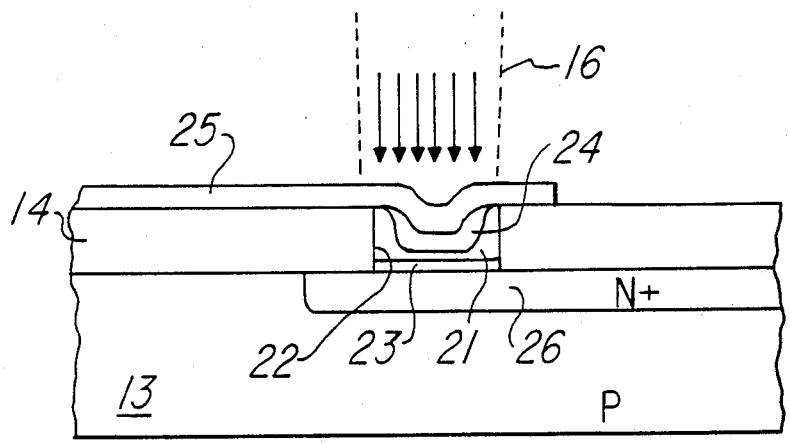
FIG. 6 is an elevation view in section of the device of FIG. 5, taken along the line 6—6 in FIG. 5.

Referring to FIGS. 5 and 6, another embodiment of the invention employs a structure in which the laser beam causes a polycrystalline silicon layer 21 to change from a non-conductive to a conductive condition. This device employs a thick insulator 14 on the silicon substrate 13, (perhaps 10,000 Å in thickness), and a vertical-walled hole 22 of about one or two microns width is etched in the insulator 14 by an anisotropic etch such as RIE. A thin conductor layer 23, tungsten, for example, is deposited in the hole 22 only on the silicon by a selective deposition process, i.e., the material deposits on silicon but not on oxide 14. The polysilicon layer 21 is next applied, first over the entire face of the slice, then restricted to the hole 22 by an anisotropic etch so it covers the sidewalls, the polysilicon is also left to cover the bottom of the hole because it deposits thicker here. The polysilicon is deposited in very highly resistive form, i.e., with a very low level of doping impurity. A metal layer 24 is now created by another deposition and anisotropic etch. The materials of layers 21 and 24 are chosen such that selective heating by the laser beam 16, or the combination of laser beam and voltage, will cause the materials to react to create a short circuit or low resistance path. The layer 24 also serves to fill the hole 22 so that the top conductor will not have step coverage problems; the vertical-walled hole and the layers of material on the sidewalls allow very small programmable structures to be fabricated; one advantage of using the small hole with material on the sidewalls is that the surface area for the reaction is increased. A layer 25 of conductive material is added, and patterned to leave a strip which makes contact to the silicon beneath the layer 23 only if this structure has been preprogrammed. A region 26 in the substrate 13 such as N+ silicon, is thus the second conductor of the make-link, instead of another conductor on the top face as before.

The material of the conductor strip 25 usually would be aluminum, or it may be a refractory such as tungsten or molybdenum, for example. The layer 21 is highly-resistive polysilicon, and the layer 24 which reacts with the polysilicon is aluminum or molybdenum. The layer 23 acts as a barrier, i.e., it aids in preventing the reaction of materials of layers 21 and 24 from harming the silicon substrate.

While this invention has been described with reference to illustrative embodiments, this description is not intended to be construed in a limiting sense. Various modifications to the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making and programming a laser-beam programmable device at a face of a semiconductor body, comprising:
    forming a first conductive layer over a portion of said face;
    forming a second conductive layer over a portion of said face, said second conductive layer not touching said first conductive layer;
    forming an insulating layer over a first target area of said first conductive strip and a second target area of said second conductive strip;
    forming a conductive strip over said first and second target areas; and
    exposing said first and second target areas to a laser beam, said first and second target areas lying within the area of said laser beam, said insulating layer being altered by the laser beam to create a conductive path from said first conductive layer through said conductive strip to said second conductive layer;
    wherein said first and second conductive layers, and said conductive strip, are formed of materials different from one another.

* * * * *